United States Patent [19]

Treffer

[11] Patent Number: 4,908,337
[45] Date of Patent: Mar. 13, 1990

[54] FOIL FOR SOLDERING THE TERMINALS OF AN ELECTRONIC COMPONENT

[75] Inventor: Frank Treffer, Mainz, Fed. Rep. of Germany

[73] Assignee: VDO Adolf Schindling AG, Frankfurt am Main, Fed. Rep. of Germany

[21] Appl. No.: 176,840

[22] Filed: Apr. 4, 1988

[30] Foreign Application Priority Data

May 2, 1987 [DE] Fed. Rep. of Germany ....... 3714694

[51] Int. Cl.4 ............................................ H01R 43/00
[52] U.S. Cl. .................................. 439/876; 228/180.1; 228/246; 29/827
[58] Field of Search .................. 439/876; 29/827, 840; 174/702; 228/180.1, 246

[56] References Cited

U.S. PATENT DOCUMENTS

| 4,246,697 | 1/1981 | Smith | 29/827 |
| 4,721,992 | 1/1988 | Emamjomeh et al. | 29/827 X |
| 4,812,421 | 3/1989 | Jung et al. | 29/827 X |

Primary Examiner—Timothy V. Eley
Attorney, Agent, or Firm—Martin A. Farber

[57] ABSTRACT

A foil (15) has cutouts (17) which are bridged over by strips of solder (18, 19). The cutouts (17) are so dimensioned that the strips of solder (18, 19) can be placed transversely over the ends of conductive paths (9–14). The terminals (3–8) of the corresponding electronic component (2) are then placed on the strips of solder (18, 19). Pressure is exerted by means of a ram and heat applied, which leads to the melting of the strips of solder (18, 19) and thus to the soldering of the terminals (3–8) to the conductive paths (9–14).

5 Claims, 1 Drawing Sheet

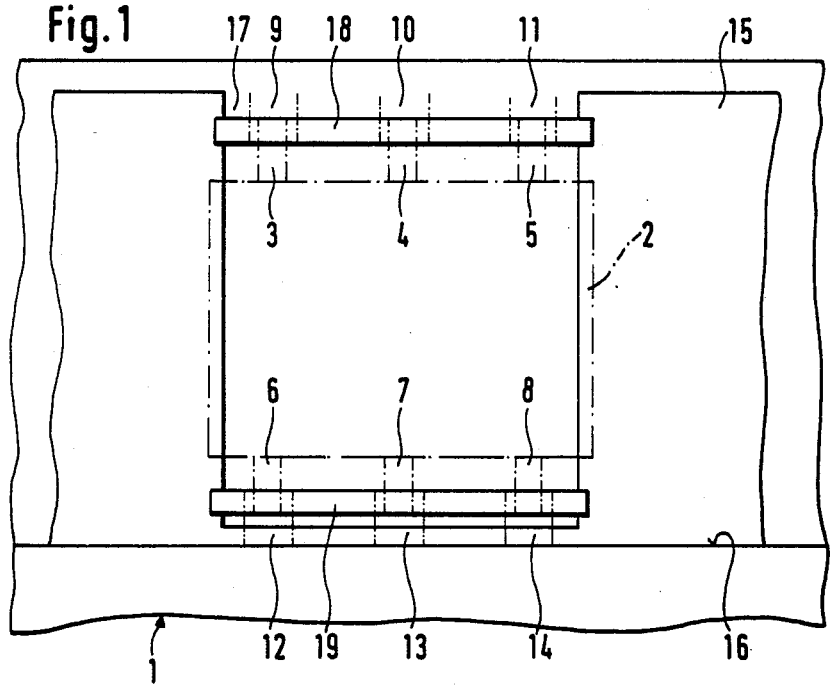
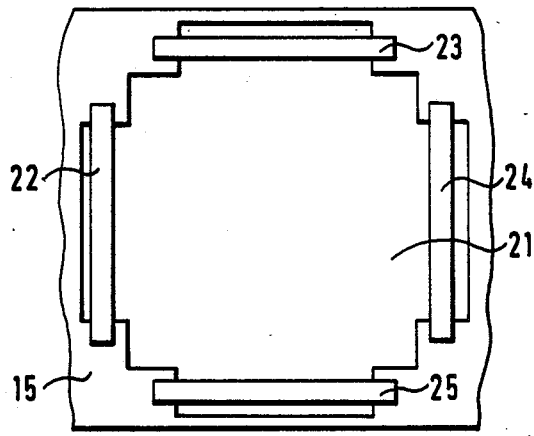

FOIL FOR SOLDERING THE TERMINALS OF AN ELECTRONIC COMPONENT

FIELD AND BACKGROUND OF THE INVENTION

The present invention relates to a method of soldering the terminals of an electronic component to conductive paths of a board by applying a soldering strip of solder material which bridges over a plurality of terminals followed by feeding heat in order to melt the solder strip. The invention also concerns a foil for the carrying out of this method.

Electronic components have up to now generally been soldered to the conductive paths of a board by means of a so-called solder wave. This necessarily leads to different layer thicknesses of the conductive paths which extend in longitudinal and transverse direction.

Furthermore, in the case of large layer thicknesses there are strong stresses between the conductive path coated with solder and the support which has the conductive path, which may lead to a loosening of the conductive paths.

In the case of liquid crystal displays it is also known to apply over the conductive paths a foil which bears strips of solder on the side facing away from the conductive paths, these strips bridging over the conductive paths which are to be contacted by electric terminals of electronic components. Wherever an electric terminal is to be soldered to a conductive path, a small cutout in the form of a window is provided in the foil. After the placing-on of the foil, the electronic components are placed on the foil and heat is then fed by means of a ram which presses against the terminals. This method of soldering has the disadvantage that the individual cutouts must agree very precisely in dimensions with the position of the conductive paths. In particular, if a number of components are to be soldered on a support one after the other and if foil with strips of solder from a roll is to be used for this, such strong deviations between the cutouts and the conductive paths result due to the summation of tolerances that proper soldering is no longer assured.

SUMMARY OF THE INVENTION

It is an object of the invention to provide a method of the aforementioned type by which a plurality of electronic components to be arranged one behind the other can be soldered onto conductive paths of a board without any problems as to tolerances. Furthermore, a foil is to be developed for the carrying out of this method of soldering.

According to the invention, the strip of solder is placed directly on the board over a plurality of conductive paths to be contacted by the terminals, the electronic component with its terminals is placed on top of this, and heat is then fed in order to melt the strip of solder.

In this manner of procedure, the conductive paths are first of all connected to each other by the strips of solder and thus short circuited. Surprisingly, as it melts, the solder material, however, pulls off from the board onto the terminals and conductive paths, so that the conductive paths are not electrically connected with one another after the soldering. By adapting the thickness and width of the strip of solder to the width of the conductive paths it can be seen to that precisely determined amounts of solder come onto the conductive paths and thus exact thicknesses of solder layers are produced, in contradistinction to soldering with a solder wave.

The required exact positioning of the strips of solder over the conductive paths is very easy to effect if, in accordance with one advantageous embodiment of the invention, at least one strip of solder is initially placed over a cutout in a foil and fastened there, and this foil is then aligned on the board over the conductive paths.

Layers of solder for a plurality of electronic components can be applied all at once with little labor if a foil having a plurality of cutouts each of which is bridged over by at least one strip of solder is used.

The second object, namely to create a foil which has strips of solder for the soldering of the terminals of electronic components to conductive paths of a board, and cutouts bridged over by strips of solder, is obtained in accordance with the invention in the manner that the cutouts (17, 21) cover a plurality of conductive paths (9–14).

Such a foil has the advantage over the known foil with cutouts for each conductive path that it is less subject to tolerances. This is very important with such foils since they easily change their length, for instance, due to the influence of temperature.

For electronic components which have electric terminals on two opposite sides it is advantageous if the cutouts (17) are bridged over by the solder strips (18, 19) on two opposite sides. In this way, the two required strips of solder can be applied in one operation by the file.

Such a foil can be made very narrow if the cutouts (17) are rectangular foil cutouts which are open towards one side.

However, it is also possible for the cutouts (21) to be windows which are surrounded by foil material on all sides.

Window-shaped cutouts are advantageous particularly if electronic components having terminals on four sides are to be soldered onto conductive paths since in such case each window-like cutout (21) can be bridged over on each of its four edges by a solder strip (22–25), so that all the required solder strips together with the foil can be applied and positioned in one operation.

With the above and other objects and advantages in view, the present invention will become more clearly understood in connection with the detailed description of a preferred embodiment, when considered with the accompanying drawing, of which:

BRIEF DESCRIPTION OF THE DRAWING

FIG. 1 is a top view of a region, essential for the method of the invention, of a liquid crystal cell having a foil which holds solder strips which are placed thereon; and FIG. 2 is a top view of a part of an embodiment of the foil which is modified as compared with FIG. 1.

DETAILED DESCRIPTION OF THE PREFERRED EMBODIMENT

FIG. 1 shows a region of a liquid crystal cell 1 on which the terminals 3, 4, 5, 6, 7, 8 of an electronic component 2, shown in dot-dash line, are to be soldered to the ends of conductive paths 9–14. Before the soldering of the electronic component 2, flux is first of all added to the soldering region of the liquid crystal cell 1, and a foil 15 is then placed on the liquid crystal cell 1 in such a manner that the foil rests against an edge 16 of the liquid crystal cell 1 and is thereby positioned in one direction. The foil 15 has a rectangular cutout 17 which is open on one side and is bridged over near the two edges of the foil 15 by one solder strip 18, 19 each. These solder strips 18, 19 are fastened on the foil 15 on the side thereof facing the liquid crystal cell 1 and lie on the conductive paths 9-14.

When the foil 15 has been correctly aligned also in longitudinal direction, the electronic component 2 is placed with its terminals 3-8 on the solder strips 18, 19 over the conductive paths 9-14. Thereupon a ram (not shown) is placed on the terminals 3-8 and heat is fed under pressure. This leads to the melting of the solder strips 18, 19 and thus to a soldering of the terminals 3-8 to the conductive paths 9-14. Surprisingly, upon the melting of the solder strips 18, 19 on the conductive paths 9-14 the solder material pulls away so that the conductive paths are not connected to each other by the solder material, and thus not short circuited. After the soldering, the foil 15 need merely be withdrawn from the liquid crystal cell.

FIG. 2 shows that the foil 15 can also have cutouts 21 which are developed in window shape and have an extension of the cutout on each of their four edges, the extensions being covered by solder strips 22, 23, 24 and 25 respectively. By means of such a foil 15 it is possible to solder electronic components which have electric terminals on four sides to conductive paths in a single operation by the method of the invention.

The electronic components are ICs in the case of liquid crystal cells. Each liquid crystal cell 1 has a plurality of such ICs one behind the other. For this reason, there is used a foil which also has cutouts 17 and 21 respectively one behind the other at the same distance apart as the arrangement places for the ICs so that the solder strips 18, 19; 22-25 of all ICs can be applied simultaneously.

I claim:

1. A foil with strips of solder disposed on the soil, the strips of solder being positioned for soldering terminals of electronic components to conductive paths on a board which supports the electronic components, the foil being formed with cutouts, the cutouts being bridged over by the strips of solder; and wherein the cutouts are configured to expose a plurality of the conductive paths to the strips of solder upon an emplacement of the foil upon the board with the cutouts in registration with said terminals.

2. A foil according to claim 1, wherein the cutouts of the foil are bridged over by the solder strips on two opposite sides of a cutout.

3. A foil according to claim 1, wherein the cutouts are rectangular foil cutouts which are open on one side.

4. A foil according to claim 1, wherein the cutouts are windows which are surrounded by foil material on all sides.

5. A foil according to claim 4, wherein each of the cutouts is a window-like cutout bounded by four edges; and a central portion of each edge is receded from a central portion of the cutout to provide support regions at the ends of each edge to support respective ones of the strips of solder bridged over edge regions of the cutout.

* * * * *